(12) United States Patent
Cai et al.

(10) Patent No.: US 9,018,711 B1
(45) Date of Patent: Apr. 28, 2015

(54) SELECTIVE GROWTH OF A WORK-FUNCTION METAL IN A REPLACEMENT METAL GATE OF A SEMICONDUCTOR DEVICE

(71) Applicant: GLOBALFOUNDRIES Inc., Grand Cayman (KY)

(72) Inventors: Xiuyu Cai, Niskayuna, NY (US); Hoon Kim, Clifton Park, NY (US); Xunyuan Zhang, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/056,144

(22) Filed: Oct. 17, 2013

(51) Int. Cl.
| | |
|---|---|
| H01L 21/8238 | (2006.01) |
| H01L 21/336 | (2006.01) |
| H01L 21/3205 | (2006.01) |
| H01L 21/4763 | (2006.01) |
| H01L 21/28 | (2006.01) |
| H01L 29/51 | (2006.01) |
| H01L 29/49 | (2006.01) |
| H01L 27/092 | (2006.01) |

(52) U.S. Cl.
CPC ........ *H01L 21/28008* (2013.01); *H01L 29/517* (2013.01); *H01L 29/4966* (2013.01); *H01L 27/092* (2013.01)

(58) Field of Classification Search
CPC .............. H01L 21/768; H01L 21/3213; H01L 21/32133; H01L 23/50
USPC .................. 438/199, 285–288, 589; 257/410, 257/E21.295, E29.255, 369, E21.409
See application file for complete search history.

(56) References Cited

U.S. PATENT DOCUMENTS

| | | | |
|---|---|---|---|
| 8,232,204 B1 * | 7/2012 | Horak et al. ................... | 438/675 |
| 8,785,283 B2 | 7/2014 | Chen et al. | |
| 2005/0093035 A1 * | 5/2005 | Yagishita et al. ............. | 257/288 |
| 2006/0263966 A1 * | 11/2006 | Kim et al. ..................... | 438/218 |
| 2007/0111419 A1 * | 5/2007 | Doyle et al. .................. | 438/197 |
| 2009/0170267 A1 * | 7/2009 | Shah et al. .................... | 438/283 |
| 2011/0156107 A1 * | 6/2011 | Bohr et al. .................... | 257/288 |
| 2012/0088358 A1 * | 4/2012 | Lee et al. ...................... | 438/589 |
| 2012/0248509 A1 * | 10/2012 | Guo et al. ..................... | 257/288 |
| 2014/0084383 A1 * | 3/2014 | Cai et al. ....................... | 257/401 |
| 2014/0151763 A1 | 6/2014 | Hung et al. | |
| 2014/0154852 A1 | 6/2014 | Chen et al. | |
| 2014/0199837 A1 | 7/2014 | Hung et al. | |
| 2014/0217481 A1 | 8/2014 | Guo et al. | |
| 2014/0256094 A1 * | 9/2014 | Lin et al. ....................... | 438/158 |
| 2014/0346575 A1 * | 11/2014 | Chen et al. .................... | 257/288 |
| 2014/0349452 A1 * | 11/2014 | Wang et al. ................... | 438/238 |
| 2014/0349476 A1 * | 11/2014 | Chen et al. .................... | 438/620 |

\* cited by examiner

*Primary Examiner* — Amar Movva
*Assistant Examiner* — Sheikh Maruf
(74) *Attorney, Agent, or Firm* — Williams Morgan, P.C.

(57) ABSTRACT

Approaches for forming a replacement metal gate (RMG) of a semiconductor device, are disclosed. Specifically provided is a p-channel field effect transistor (p-FET) and an n-channel field effect transistor (n-FET) formed over a substrate, the p-FET and the n-FET each having a recess formed therein, a high-k layer and a barrier layer formed within each recess, a work-function metal (WFM) selectively grown within the recess of the n-FET, wherein the high-k layer, barrier layer, and WFM are each recessed to a desired height within the recesses, and a metal material (e.g., Tungsten) formed within each recess. By providing a WFM chamfer earlier in the process, the risk of mask materials filling into each gate recess is reduced. Furthermore, the selective WFM growth improves fill-in of the metal material, which lowers gate resistance in the device.

15 Claims, 11 Drawing Sheets

US 9,018,711 B1

SELECTIVE GROWTH OF A WORK-FUNCTION METAL IN A REPLACEMENT METAL GATE OF A SEMICONDUCTOR DEVICE

BACKGROUND

1. Technical Field

This invention relates generally to the field of semiconductors and, more particularly, to forming a replacement metal gate (RMG) of a semiconductor device.

2. Related Art

Metal-oxide-semiconductor (MOS) transistors using polysilicon gate electrodes are known. Polysilicon material is able to tolerate high temperature processing better than most metals, so that polysilicon can be annealed at high temperatures along with source and drain regions. In addition, polysilicon blocks ion implantation of doped atoms into a channel region, facilitating the formation of self-aligned source and drain structures after gate patterning is completed.

The high resistivities of polysilicon materials, as compared to most metal materials, result in polysilicon gate electrodes that operate at much slower speeds than gates made of metallic materials. One way of compensating for the higher resistance of polysilicon materials is to perform extensive silicide processing on the polysilicon materials so that the speed of operation of the polysilicon materials is increased to acceptable levels.

Another way of compensating for the higher resistance polysilicon materials is to replace a polysilicon gate device with a metal gate device. This replacement can be done with a replacement metal gate (RMG) process, wherein the higher temperature processing is performed while the polysilicon is present in the substrate, and, after such processing, the polysilicon is removed and replaced with metal to form the replacement metal gate. More specifically, a device with a disposable polysilicon gate is processed, and the disposable gate and dielectrics are etched away, exposing an original gate oxide. The disposable polysilicon gate is then replaced by a metal gate having lower resistivity than the polysilicon material.

RMG is desirable for achieving a device target at 20 nm and beyond. However, as gate dimensions shrink, gate resistance increases and more low-resistance metal such as tungsten (W) is needed relative to higher resistance work-function metal (WFM) such as TiN. Therefore, it is necessary for gate WFM chamfering to be performed. This is demonstrated in prior art device 100 of FIG. 1. Here, device 100 comprises a stack of layers (i.e., a substrate 102, a source/drain (S/D) layer 104 formed over the substrate, and an interlayer dielectric (IDL) layer 106 formed over the S/D layer 104), and a recess 110 formed therein. Device 100 further comprises a set of spacers 112 positioned adjacent recess 110, and a plurality of layers formed over device 100 and within recess 110, i.e., a hafnium oxide (HfO2) layer 114, a barrier layer 116 (e.g., titanium nitride (TiN)), a work-function (WF) layer 118, a capping layer 120 (e.g., TiN), and an organic dielectric layer (ODL) 122 or any other patterning mask material, which is recessed. However, tight PC dimensions make metal chamfering challenging. In this embodiment, a narrow gap (e.g., less than 2 nm) is difficult to fill in with the ODL or any other patterning mask material.

In another approach, shown in FIG. 2, a pinch-off of TiN 220 causes a seam/void 230 to form in recess 210, which results in a non-uniform or catastrophic metal recess. Therefore, this approach is also undesirable.

SUMMARY

In general, approaches for forming a replacement metal gate (RMG) of a semiconductor device, are disclosed. Specifically, provided is a p-channel field effect transistor (p-FET) and an n-channel field effect transistor (n-FET) formed over a substrate, the p-FET and the n-FET each having a recess formed therein, a high-k layer, a barrier layer, and an optional metal layer formed within each recess, a work-function metal (WFM) selectively grown within the recess of the n-FET, and a metal material (e.g., Tungsten) formed within each recess. By performing a chamfer of the high-k layer, barrier layer, and the metal layer earlier in the process, the risk of mask materials filling into each gate recess is reduced. Furthermore, the selective WFM growth (e.g., of a single-element metal as opposed to a metal compound) improves fill-in of the metal material, which lowers gate resistance in the device.

One aspect of the present invention includes method for forming a replacement metal gate (RMG) of a semiconductor device, the method comprising: providing a set of field effect transistors (FET) formed over a substrate, each of the set of FETs having a recess formed therein; forming a high-k layer over the semiconductor device and within each recess; forming a barrier layer over the high-k layer; forming an organic dielectric layer (ODL) within each recess; recessing the ODL to a desired height within each recess; removing the high-k layer and the barrier layer from atop the semiconductor device selective to the ODL within each recess; removing the ODL from within each recess; selectively growing a work-function metal (WFM) within one of the recesses; and forming a metal material within each recess.

Another aspect of the present invention includes a method for selectively growing a work-function metal (WFM) within a replacement metal gate (RMG) of a semiconductor device, the method comprising: providing a p-channel field effect transistor (p-FET) and an n-channel field effect transistor (n-FET) formed over a substrate, the p-FET and the n-FET each having a recess formed therein; forming a high-k layer over the semiconductor device and within each recess; forming a barrier layer over the high-k layer; forming an organic dielectric layer (ODL) within each recess; recessing the ODL to a desired height within each recess; removing the high-k layer and the barrier layer from atop the semiconductor device selective to the ODL within each recess; removing the ODL from within each recess; and selectively growing a work-function metal (WFM) within one of the recesses.

Yet another aspect of the present invention includes a semiconductor device, comprising: a p-channel field effect transistor (p-FET) and an n-channel field effect transistor (n-FET) formed over a substrate, the p-FET and the n-FET each having a recess formed therein; a high-k layer formed within each recess; a barrier layer formed over the high-k layer within each recess; a work-function metal (WFM) selectively grown within the recess of the n-FET; and a metal material formed within each recess.

BRIEF DESCRIPTION OF THE DRAWINGS

These and other features of this invention will be more readily understood from the following detailed description of the various aspects of the invention taken in conjunction with the accompanying drawings in which.

Figure 2:
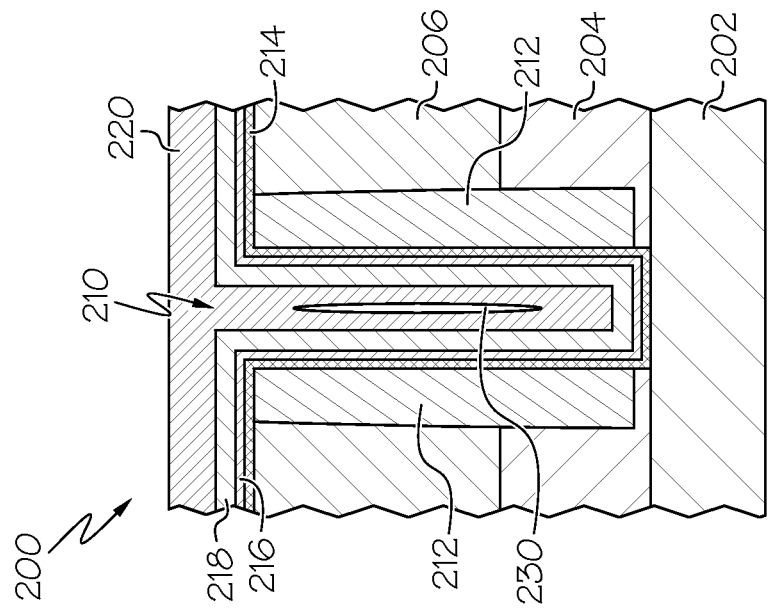
FIG. 2 shows a cross-sectional view of another WFM recess process in a prior art semiconductor device.
Figure 1:
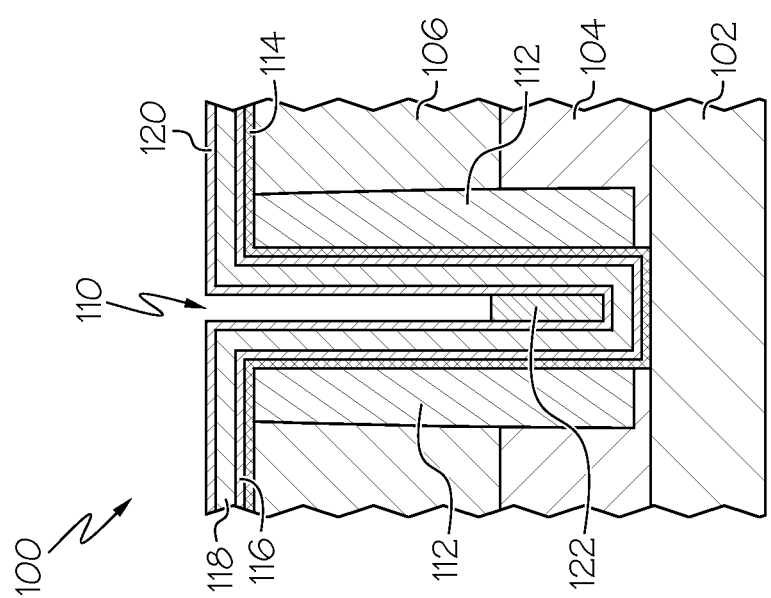
FIG. 1 shows a cross-sectional view of a WFM recess process in a prior art semiconductor device.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Also, for clarity, some reference numbers may be omitted in certain drawings.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

As mentioned above, approaches for forming a replacement metal gate (RMG) of a semiconductor device are disclosed. Specifically, provided is a p-channel field effect transistor (p-FET) and an n-channel field effect transistor (n-FET) formed over a substrate, the p-FET and the n-FET each having a recess formed therein, a barrier layer formed within each recess, a work-function metal (WFM) selectively grown within the recess of the n-FET, and a metal material (e.g., Tungsten) formed within each recess. By performing a WFM chamfer earlier in the process, the risk of mask materials filling into each gate recess is reduced. Furthermore, the selective WFM growth methodology makes it easier to fill-in of the patterning mask material such as ODL, because of the reduced required WFM thickness before metal chamfering.

Figure 3:
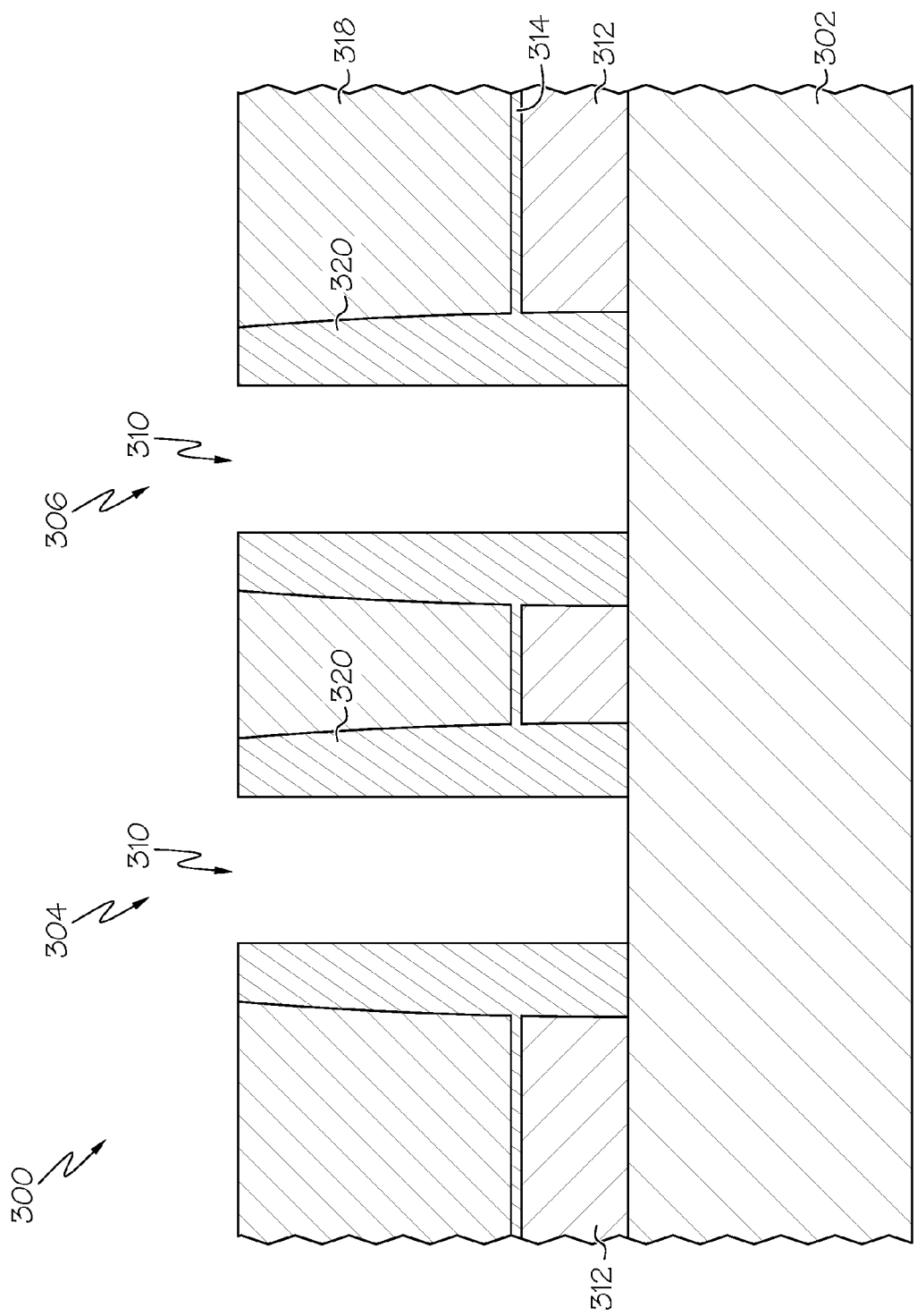
FIG. 3 shows a cross-sectional view of a semiconductor device following a dummy polysilicon pull according to illustrative embodiments.

With reference again to the figures, FIG. 3 shows a cross sectional view of a semiconductor device 300 according to an embodiment of the invention. Device 300 comprises a substrate 302 having an n-FET 304 and a p-FET 306 formed thereon, n-FET 304 and p-FET 306 each having a recess 310 formed therein. Each recess 310 is formed following a dummy polysilicon pull, as is known in the art. Device 300 further comprises source/drains (S/D) 312, a liner layer 314 (e.g., SiN), an oxide interlayer dielectric (ILD) 318, and a set of spacers 320. ILD 318 may be formed by a deposition technique known in the art, for example CVD, high-density plasma chemical vapor deposition (HDPCVD), ALD, spin-on, sputtering, or other suitable methods. ILD 318 may also contain a material that has a high etching selectivity with the polysilicon of substrate 302. As shown, each recess 310 is formed between each set of spacers 320.

In one embodiment, substrate 302 includes a silicon substrate, e.g., a wafer, either planar or finned. The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped or contain doped regions and undoped regions therein. The semiconductor substrate may contain regions with strain and regions without strain therein, or contain regions of tensile strain and compressive strain.

Furthermore, substrate 302 may be planar or finned. In a typical finned substrate, he fins usually include silicon and form the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow. FinFET devices offer several advantages over traditional, planar devices. These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

N-FET 304 and p-FET 306 may be fabricated using any suitable process including one or more photolithography and etch processes. The photolithography process may include forming a photoresist layer (not shown) overlying substrate 302 (e.g., on a silicon layer), exposing the resist to a pattern, performing post-exposure bake processes, and developing the resist to form a masking element including the resist. The masking element may then be used to form n-FET 304 and p-FET 306 into the silicon layer, e.g., using reactive ion etch (RIE) and/or other suitable processes. In one embodiment, n-FET 304 and p-FET 306 are formed by a double-patterning lithography (DPL) process. DPL is a method of constructing a pattern on a substrate by dividing the pattern into two interleaved patterns. DPL allows enhanced feature (e.g., fin) density.

Figure 4:
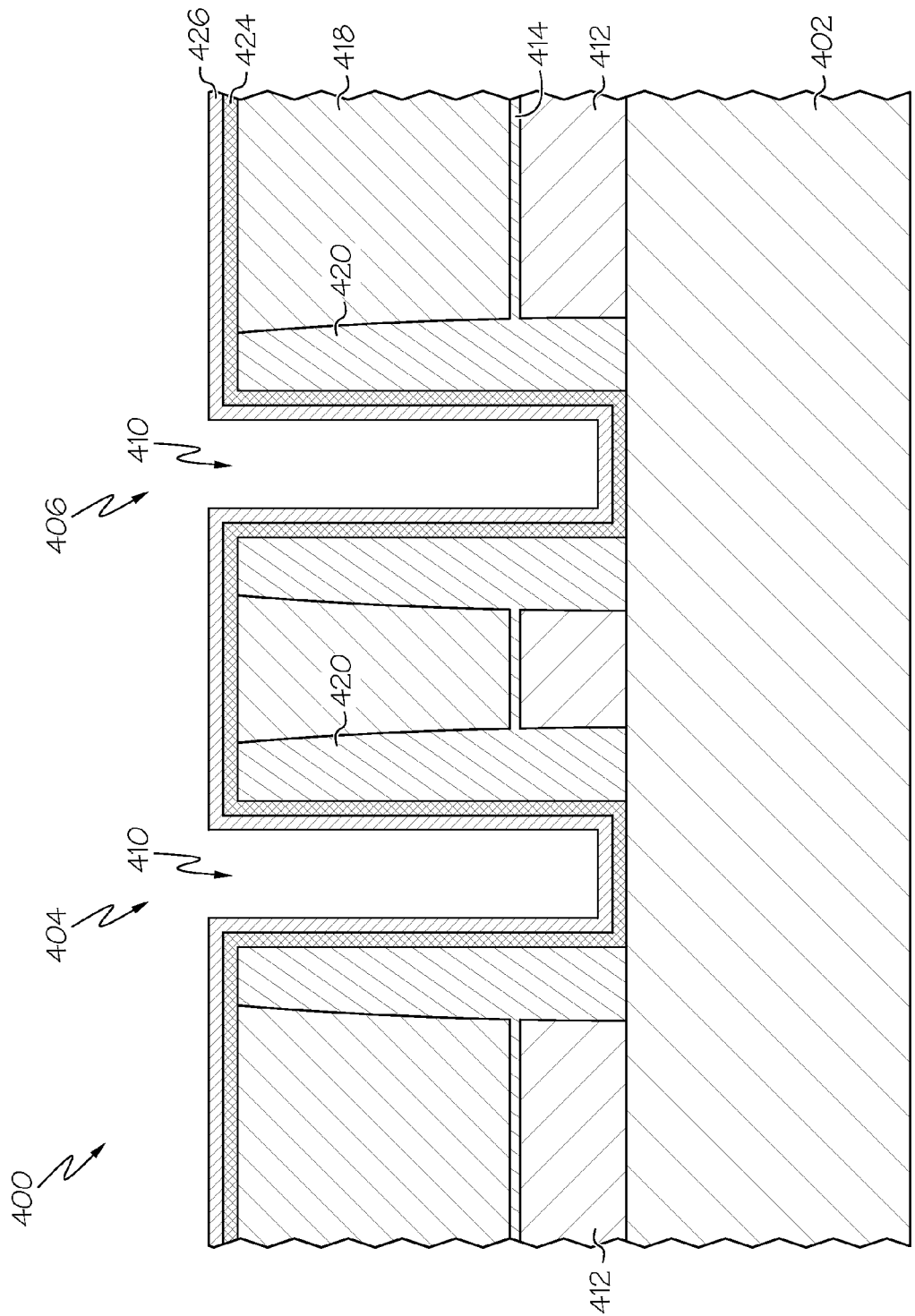
FIG. 4 shows a cross-sectional view of the semiconductor device following deposition of a first barrier layer according to illustrative embodiments.

Next, as shown in FIG. 4, a high-k layer 424 and a barrier layer 426 are formed over device 400, including within each recess 410. In this embodiment, high-k layer 424 comprises a hafnium oxide (HfO2) layer deposited to thickness of approximately 2 nm, while barrier layer 426 comprises a titanium nitride (TiN) layer deposited to a thickness of approximately 1 nm. High-k layer 424 and barrier layer 426 may be formed using ALD, which involves the deposition of successive monolayers over a substrate within a deposition chamber typically maintained at sub-atmospheric pressure. With typical ALD, successive mono-atomic layers are adsorbed to a substrate and/or reacted with the outer layer on the substrate, typically by successive feeding of different deposition precursors to the substrate surface. An exemplary ALD method includes feeding a single vaporized precursor to a deposition chamber effective to form a first monolayer over a substrate received therein. Thereafter, the flow of the first deposition precursor is ceased and an inert purge gas is flowed through the chamber effective to remove any remaining first precursor, which is not adhering to the substrate from the chamber. Subsequently, a second vapor precursor different from the first is flowed to the chamber effective to form a second monolayer on/with the first monolayer. The second monolayer might react with the first monolayer. Additional precursors can form successive monolayers, or the above process can be repeated until a desired thickness and composition layer has been formed over the substrate.

Furthermore, it will be appreciated that "high-k" generally refers to a dielectric material having a dielectric constant (k) value greater than that of silicon oxide. Preferably, the high-k material has a dielectric constant greater than 5, more preferably greater than about 10. Exemplary high-k materials include, without limitation, $HfO_2$, $ZrO_2$, $Al_2O_3$, $TiO_2$, $Ta_2O_5$, lanthanide oxides and mixtures thereof, silicates and materials such as YSZ (yttria-stabilized zirconia), BST, BT, ST, and SBT. Barrier layer 426 may comprise metals, metal nitrides, and other conductive metal compounds from vapor phase reactants. Metals, metal nitrides, metal carbides, metal borides, conductive oxides and other conductive metal compounds that can serve as substrate materials over which noble metals can be selectively deposited may include, for example and without limitation, selections from the group consisting of Ta, TaN, $TaC_x$, $TaB_x$, Ti, TiN, $TiC_x$, $TiB_x$, Nb, NbN, $NbC_x$, $NbB_x$ Mo, MoN, $MoC_x$, $MoB_x$, W, WN, $WC_x$, $WB_x$, V, Cr, Fe, Cu, Co, Ni, Cd, Zn, Al, Ag, Au, Ru, $RuO_x$, Rh, Pt, Pd, Ir, $IrO_x$ and Os.

Figure 5:
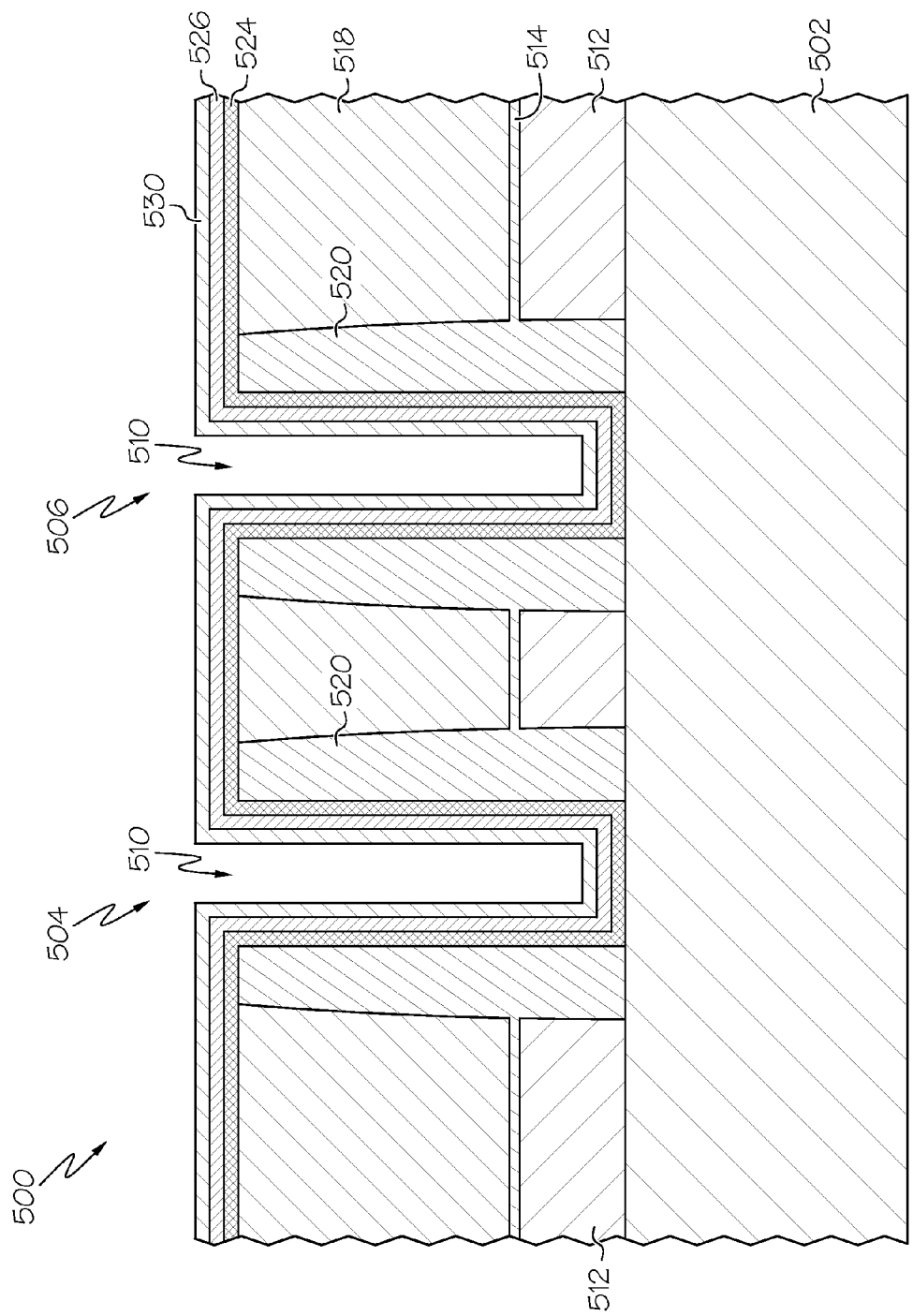
FIG. 5 shows a cross-sectional view of the semiconductor device following deposition of a metal layer according to illustrative embodiments.

In an exemplary embodiment, as shown in FIG. 5, a single-element metal layer 530 (e.g., cobalt) is formed over barrier layer 526. Metal layer 530 may be formed (e.g., using ALD) to a thickness of approximately 1 nm, which is adequate to act as a seeding layer for a subsequent selective growth of a WMF, which is preferably a single-element, "true" metal (e.g., Co, Ti, Al, etc.), as opposed to a metal compound (e.g., TiN, TiO2, etc.). Metal layer 530 conforms to device 500, including within each recess 510, as shown.

Figure 6:
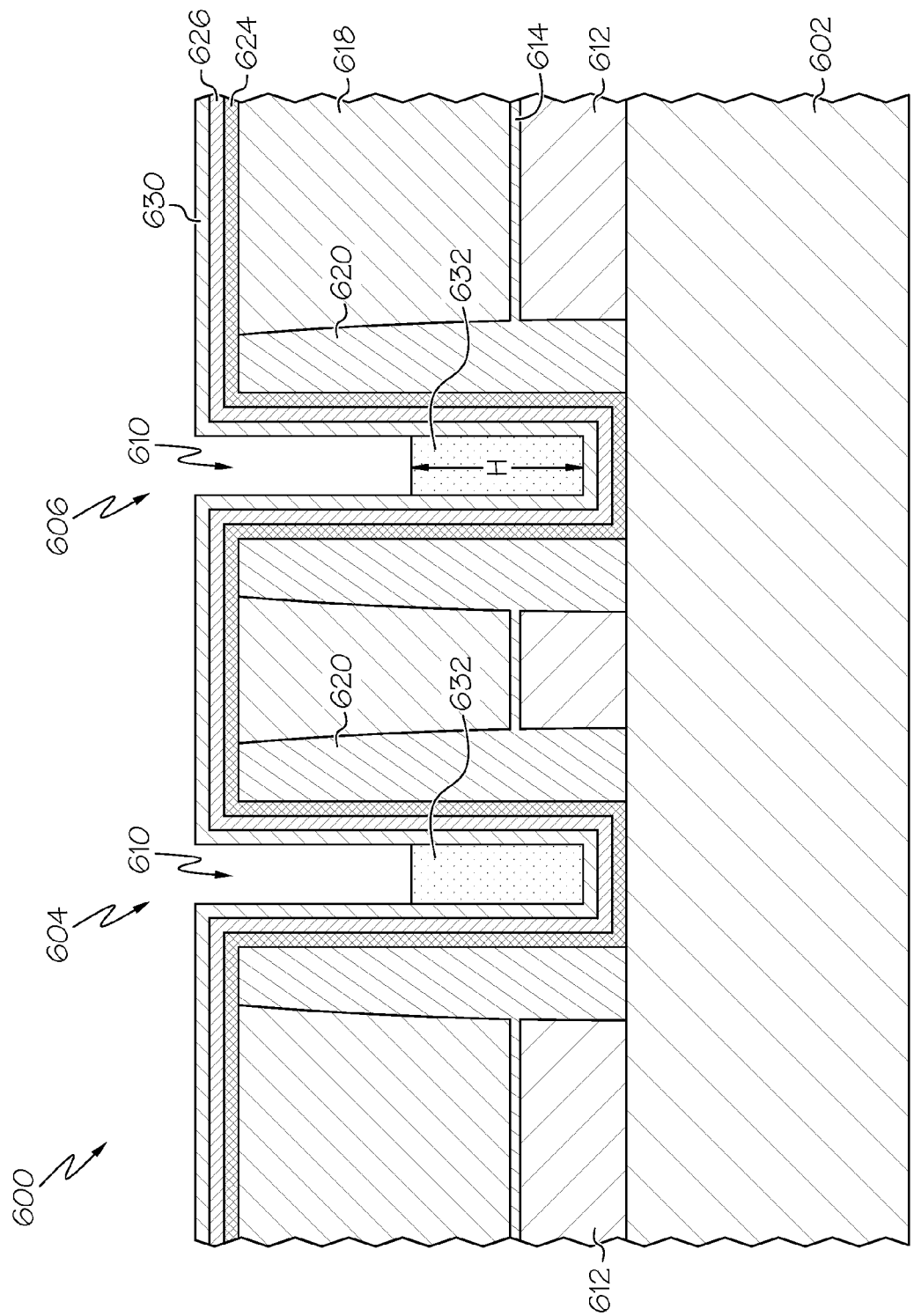
FIG. 6 shows a cross-sectional view of the semiconductor device following deposition and patterning of the ODL according to illustrative embodiments.

Next, device 600 is patterned for metal chamfering, as shown in FIG. 6. Here, an organic dielectric layer (ODL) 632 is formed within each recess 610 to a desired height 'H'. ODL 632, or other similar masking materials (e.g., an organic planarization layer (OPL)), could be used as a metal chamfer mask. ODL 632 (or OPL) may include a photo-sensitive organic polymer or an etch type organic compound. For instance, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). These materials may be formed within each recess 610 using spin-on techniques or vapor deposition techniques.

Figure 7:
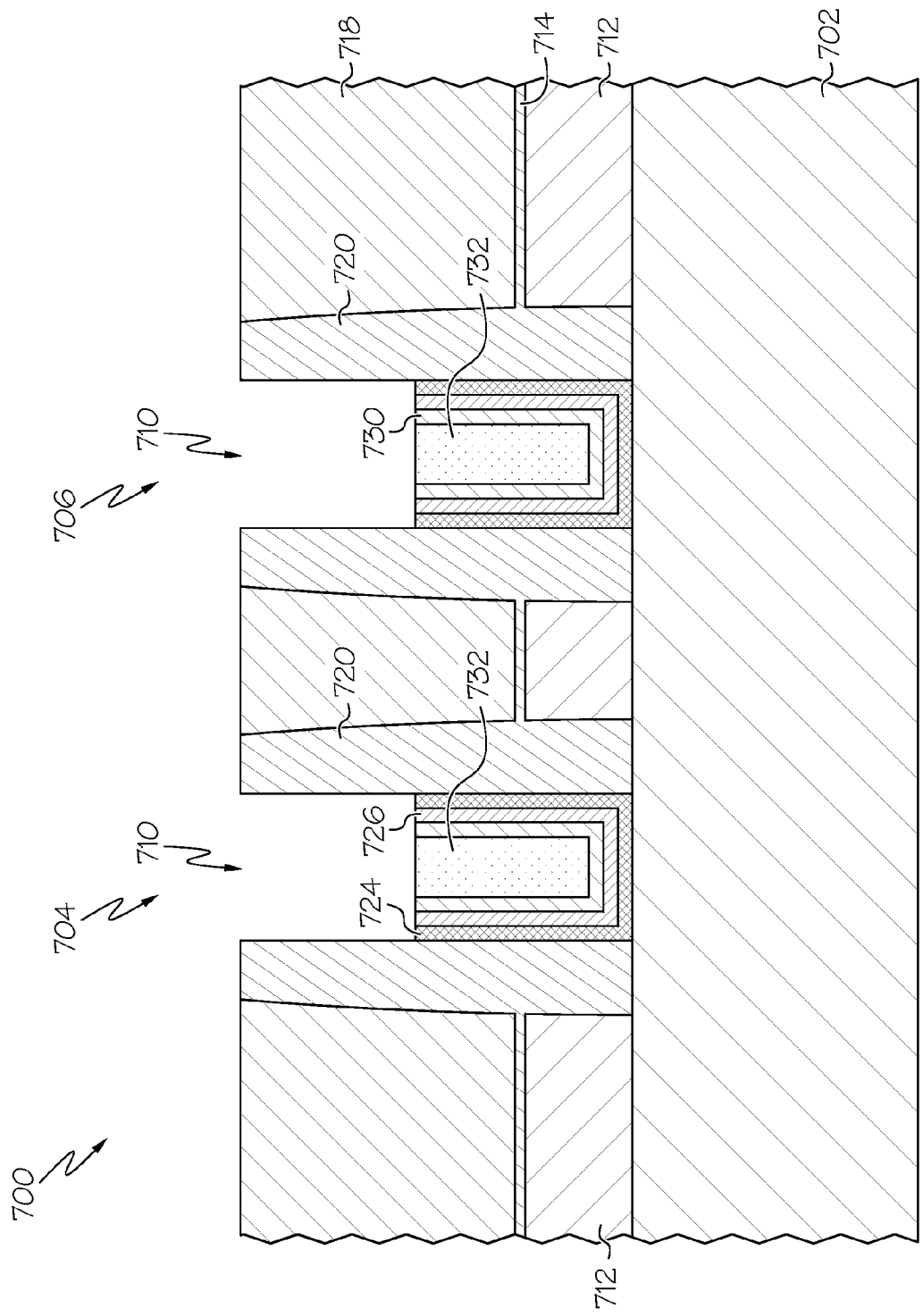
FIG. 7 shows a cross-sectional view of the semiconductor device following metal chamfering to remove the first barrier layer selective to the ODL according to illustrative embodiments.
Figure 8:
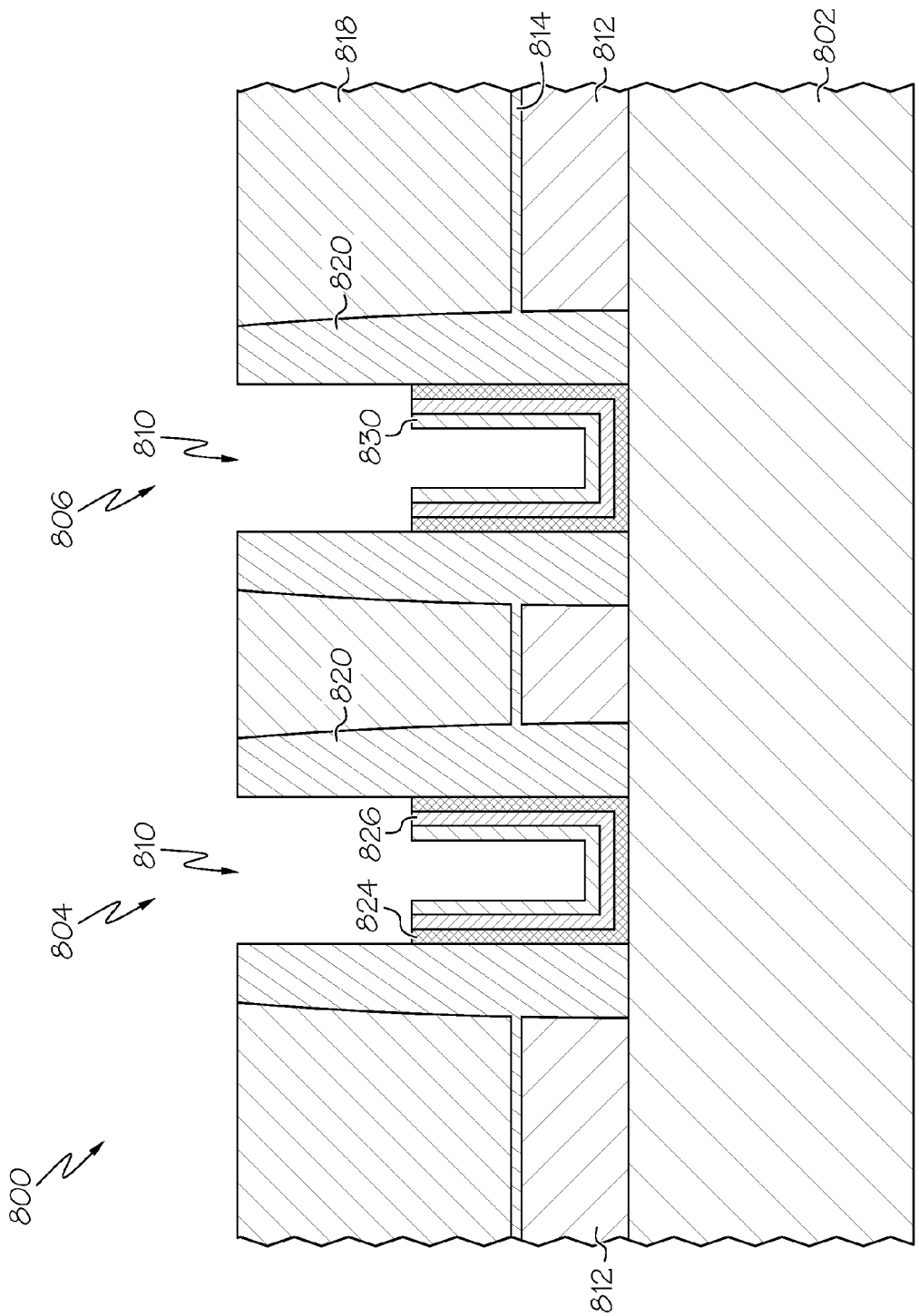
FIG. 8 shows a cross-sectional view of the semiconductor device following removal of the ODL according to illustrative embodiments.
Figure 9:
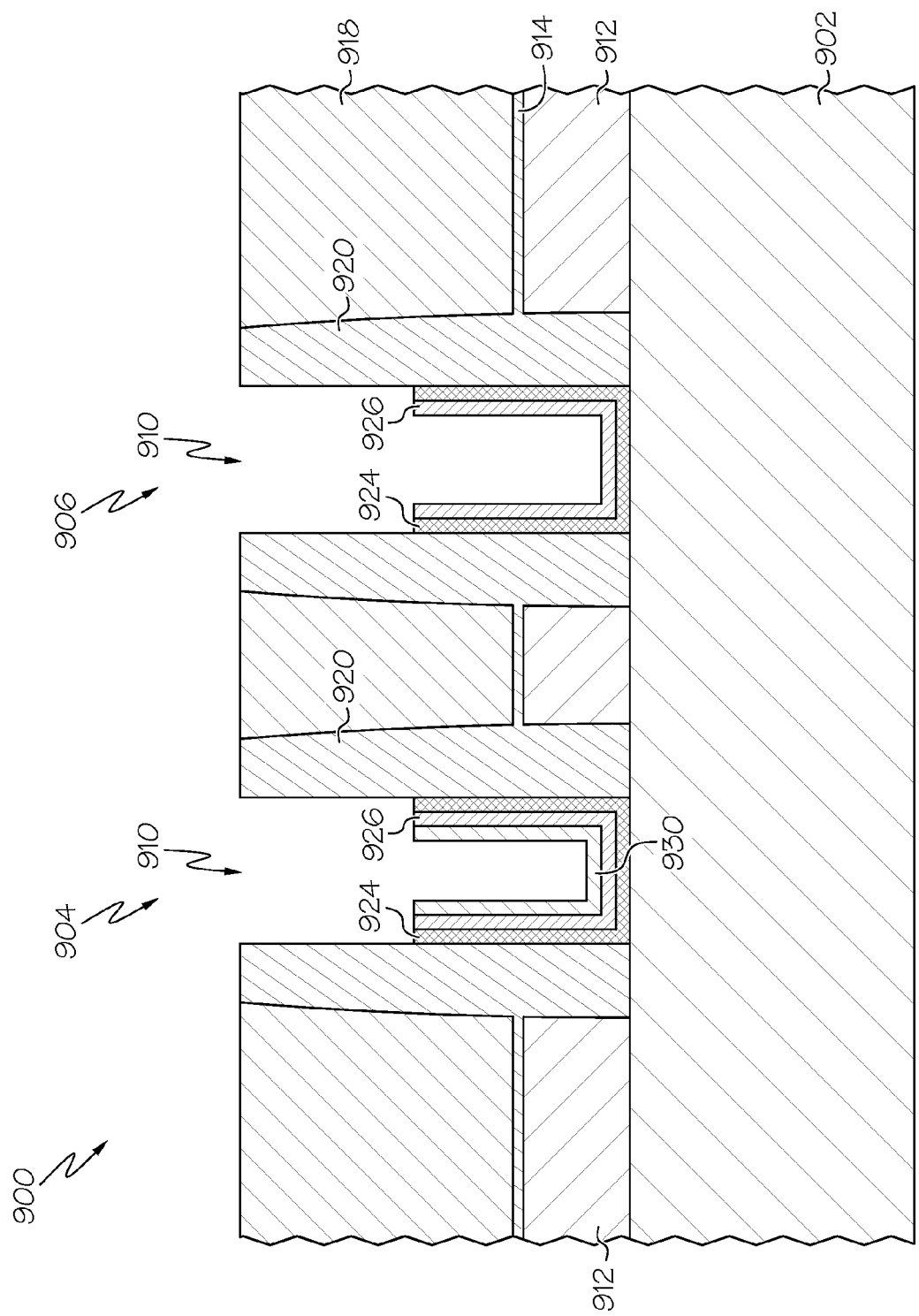
FIG. 9 shows a cross-sectional view of the semiconductor device following removal of the cobalt from the p-FET according to illustrative embodiments.

A metal chamfer is then performed, as shown in FIG. 7. In this embodiment, a wet/dry etch is performed to remove of high-k layer 724, barrier layer 726, and metal layer 730 from device 700 selective to ODL 732 within each recess 710. As shown in FIG. 8, ODL 832 is then removed from within each recess 810, followed by removal of metal layer 930 from p-FET 906, as shown in FIG. 9.

Figure 10:
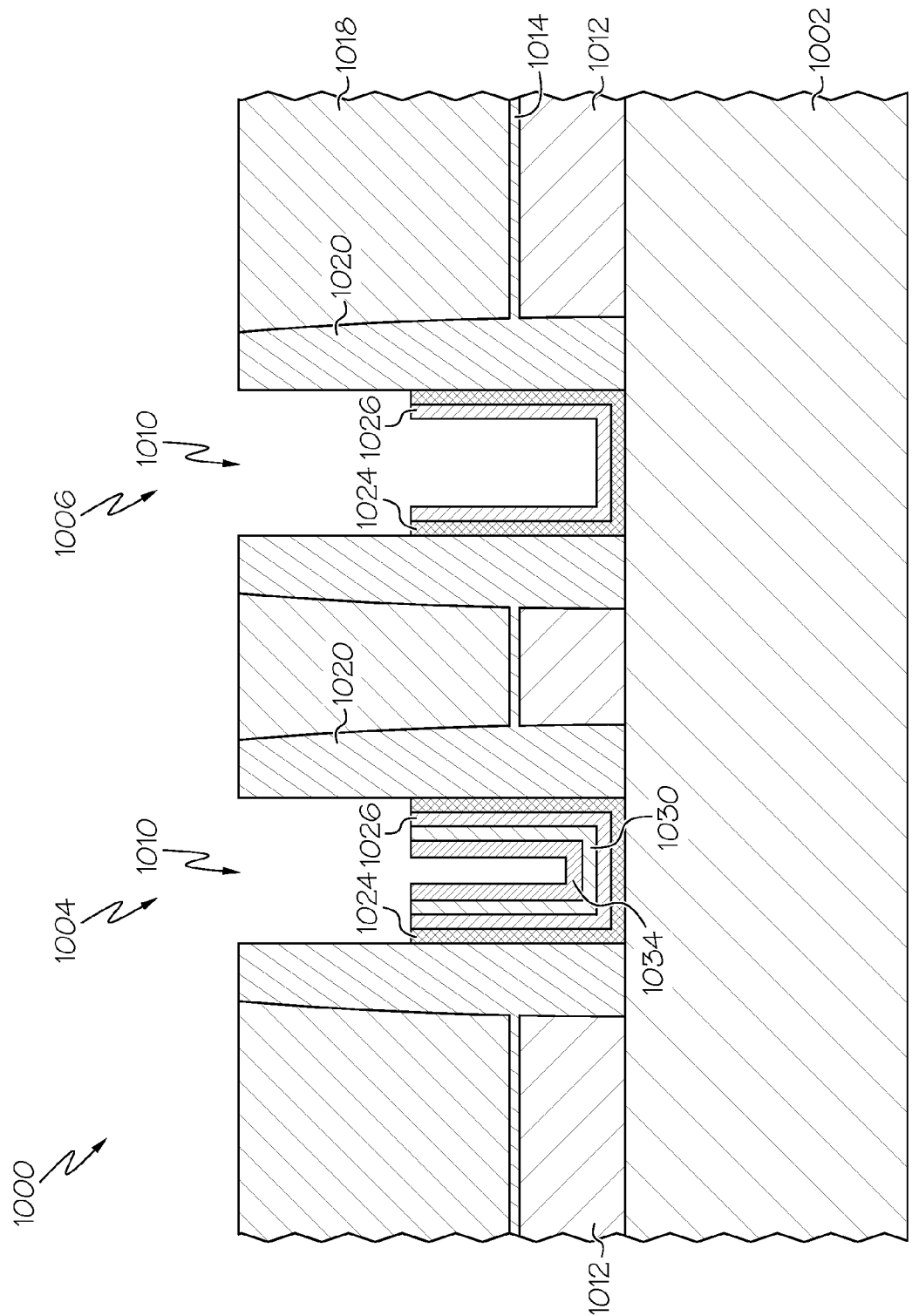
FIG. 10 shows a cross-sectional view of the semiconductor device following selective growth of the n-FET WFM according to illustrative embodiments.

Next, as shown in FIG. 10, a WFM 1034 (e.g., a single-element metal, which can serve to tune threshold voltage for NFET) is formed over metal layer 1030 within recess 1010 of n-FET 1004. In an exemplary embodiment, WFM 1034 is selectively grown over metal layer 1030 and may comprise aluminum (Al) or an Al/Ti multilayer stack, where the Al/Ti thickness can be tuned for target composition ratio to achieve the desired work function. Both Al and Ti could be selectively grown on the seeding metal layer 1030. Since Co can be oxidized in previous patterning steps, an optional in-situ H2 plasma treatment subsequently performed reduces CoOx back to Co to achieve the selective growth. In one embodiment, an additional drive-in anneal may be needed for Co/Al or Co/Al/Ti to be mixed. It will be appreciated that the selective growth of NFET WFM 1034 eliminates the need for an additional chamfer because there is no growth on the dielectric top (i.e., horizontal) surfaces of HfO2 layer 1024, barrier layer 1026, and metal layer 1030, or on the sidewalls of spacers 1020.

Figure 11:
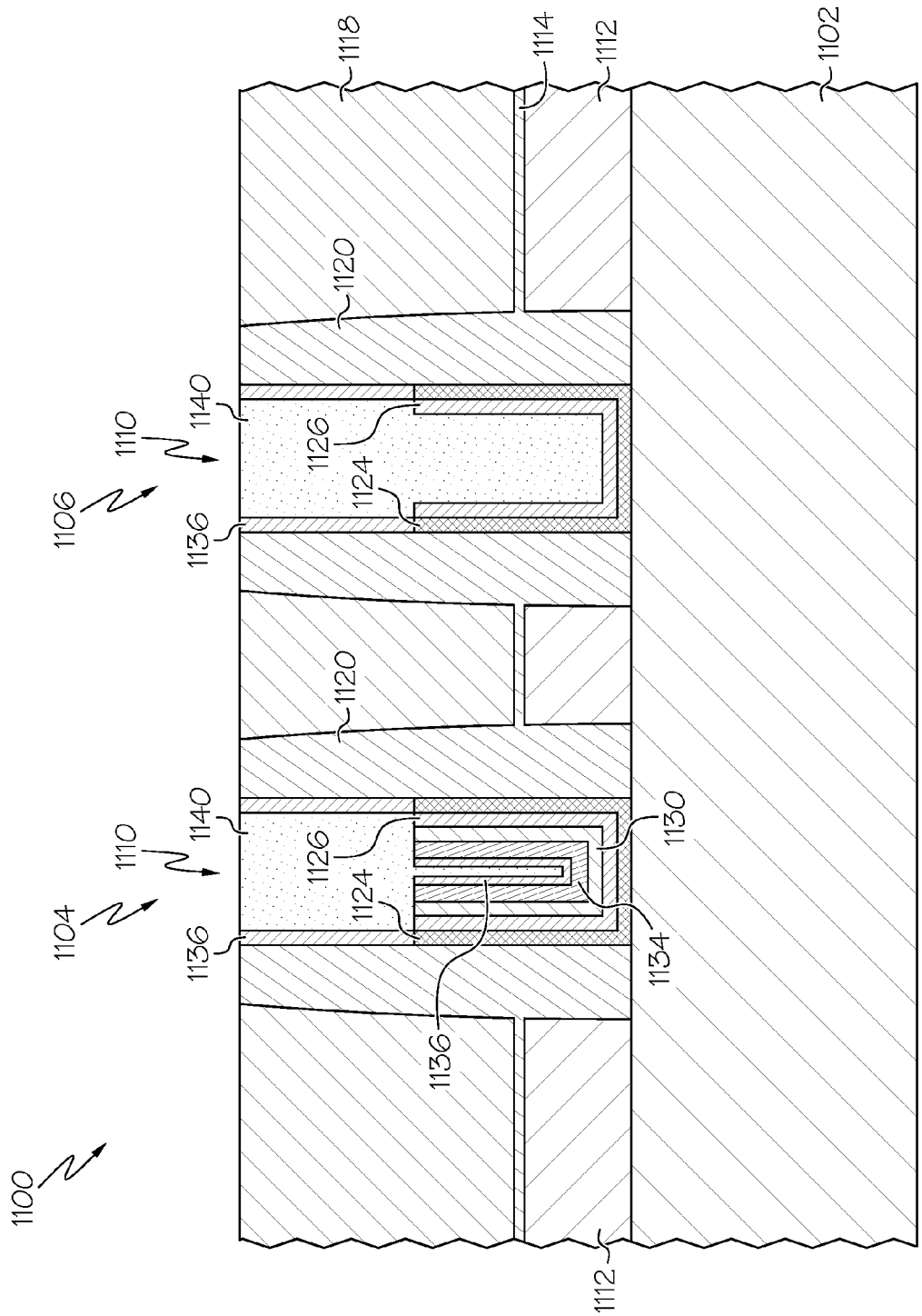
FIG. 11 shows a cross-sectional view of the semiconductor device following formation of a second barrier layer and a metal material according to illustrative embodiments.

Processing continues as shown in FIG. 11, wherein a second barrier layer 1136 (e.g., TiN) is formed over device 1100 and within each recess 1110, followed by deposition and planarization of a metal material 1140 (e.g., Tungsten) within each recess 1110. As shown, second barrier layer 1136 is formed over WFM 1134 and the sidewalls of spacers 1120 in recess 1110 of n-FET 1104, and over the sidewall of spacers 1120 in recess 1110 of p-FET 1106. Metal material 1140 is deposited over all of device 1100, and removed, e.g., via CMP, selective to ILD 118 and set of spacers 1120. As such, the RMG stacks are formed for both n-FET 1104 and p-FET 1106.

Figure 12:
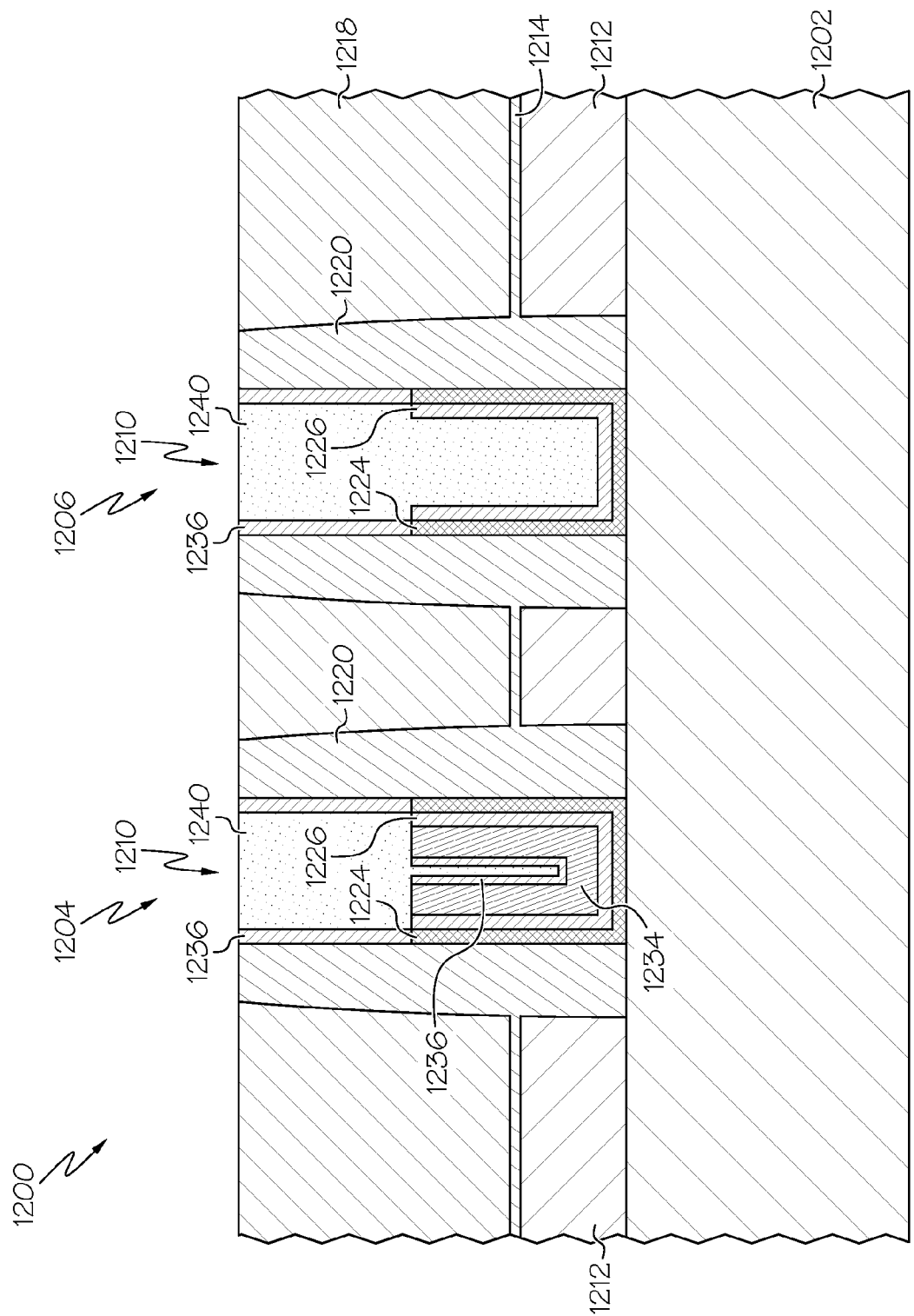
FIG. 12 shows a cross-sectional view of a semiconductor device, in which no metal layer is present, following formation of a second barrier layer and a metal material according to illustrative embodiments.

Turning now to FIG. 12, another embodiment for selectively growing WFM within the n-FET is shown. In this embodiment, processing is similar to that shown in FIGS. 3-11. However, no metal layer (e.g., cobalt) is formed over high-k layer 1224 and barrier layer 1226. Instead, WFM 1234 is selectively grown directly on barrier layer 1226, and subsequently removed from p-FET 1206, resulting in device 1200 shown in FIG. 12. Processing then continues, and second barrier layer 1236 is formed over device 1200 and within each recess 1210, followed by deposition and planarization of metal material 1240 (e.g., Tungsten) within each recess 1210. As shown, second barrier layer 1236 is formed over WFM 1234 and the sidewalls of spacers 1220 in recess 1210 of n-FET 1204, and over the sidewall of spacers 1220 in recess 1210 of p-FET 1206.

As shown and described herein, embodiments of the invention have at least the following advantages. First, early WFM chamfering eliminates the issue of mask materials filling into gate trench. Second, the selective metal growth makes it easier to increase the amount of tungsten present in the device, which lowers gate resistance.

In various embodiments, design tools can be provided and configured to create the datasets used to pattern the semiconductor layers as described herein. For example, data sets can be created to perform the processing steps described herein, including: providing a p-channel field effect transistor (p-FET) and an n-channel field effect transistor (n-FET) formed over a substrate, the p-FET and the n-FET each having a recess formed therein; forming a high-k layer over the semiconductor device and within each recess; forming a barrier layer over the high-k layer; forming an organic dielectric layer (ODL) within each recess; recessing the ODL to a desired height within each recess; removing the high-k layer and the barrier layer from atop the semiconductor device selective to the ODL within each recess; removing the ODL from within each recess; selectively growing a work-function metal (WFM) within one of the recesses; forming a second barrier layer within each recess after the WFM is selectively grown within the recess of the n-FET; and forming a metal material within each recess.

Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided approaches for selectively growing a WFM within RMGs of a semiconductor device. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a replacement metal gate (RMG) of a semiconductor device, the method comprising:
    providing a set of field effect transistors (FET) formed over a substrate, each of the set of FETs having a recess formed therein;
    forming a high-k layer over the semiconductor device and within each recess;
    forming a barrier layer over the high-k layer;
    forming an organic dielectric layer (ODL) within each recess;
    recessing the ODL to a desired height within each recess;
    removing the high-k layer and the barrier layer from atop the semiconductor device selective to the ODL within each recess;
    removing the ODL from within each recess;

selectively growing a work-function metal (WFM) within one of the recesses; and forming a metal material within each recess.

2. The method according to claim 1, further comprising forming a second barrier layer within each recess after the WFM is selectively grown within the one of the recesses.

3. The method according to claim 1, wherein the high-k layer comprises hafnium oxide, and wherein the barrier layer comprises titanium nitride.

4. The method according to claim 1, further comprising forming a metal layer over the barrier layer.

5. The method according to claim 4, further comprising removing the metal layer from another one of the recesses after the ODL is removed from each of the recesses.

6. The method according to claim 4, the metal layer comprising a single element metal.

7. The method according to claim 5, the set of FETs comprising a p-channel FET and an n-channel FET, wherein the one of the recesses is formed within the n-channel FET, and wherein the another one of the recesses is formed in the p-channel FET.

8. The method according to claim 1, further comprising forming a set of spacers formed over the substrate, wherein each recess is formed between each of the set of spacers.

9. A method for selectively growing a work-function metal (WFM) within a replacement metal gate (RMG) of a semiconductor device, the method comprising:

providing a p-channel field effect transistor (p-FET) and an n-channel field effect transistor (n-FET) formed over a substrate, the p-FET and the n-FET each having a recess formed therein;

forming a high-k layer over the semiconductor device and within each recess;

forming a barrier layer over the high-k layer;

forming an organic dielectric layer (ODL) within each recess;

recessing the ODL to a desired height within each recess;

removing the high-k layer and the barrier layer from atop the semiconductor device selective to the ODL within each recess;

removing the ODL from within each recess; and selectively growing a work-function metal (WFM) within one of the recesses.

10. The method according to claim 9, further comprising:

forming a second barrier layer within each recess after the WFM is selectively grown within the recess of the n-FET; and forming a metal material within each recess.

11. The method according to claim 9, wherein the high-k layer comprises hafnium oxide, and wherein the barrier layer comprises titanium nitride.

12. The method according to claim 9, further comprising forming a metal layer over the barrier layer.

13. The method according to claim 12, further comprising removing the metal layer from the recess of the p-FET after the ODL is removed from within each recess.

14. The method according to claim 12, the metal layer comprising a single element metal.

15. The method according to claim 9, further comprising forming a set of spacers over the substrate, wherein each recess is formed between each of the set of spacers.

* * * * *